United States Patent
Park et al.

(10) Patent No.: US 7,773,427 B2
(45) Date of Patent: Aug. 10, 2010

(54) NON-VOLATILE MEMORY DEVICE AND METHOD OF OPERATING

(75) Inventors: Ki-Tae Park, Gyeonggi-do (KR);
Doo-Gon Kim, Gyeonggi-do (KR);
Yeong-Taek Lee, Seoul (KR)

(73) Assignee: Samsung Electronics Co., Ltd.,
Suwon-Si (KR)

( * ) Notice: Subject to any disclaimer, the term of this patent is extended or adjusted under 35 U.S.C. 154(b) by 168 days.

(21) Appl. No.: 12/141,737

(22) Filed: Jun. 18, 2008

(65) Prior Publication Data
US 2008/0316818 A1    Dec. 25, 2008

(30) Foreign Application Priority Data
Jun. 19, 2007    (KR)    ........................ 10-2007-0059696

(51) Int. Cl.
*G11C 11/34*    (2006.01)
(52) U.S. Cl. ...................... 365/185.22; 365/185.18; 365/185.2
(58) Field of Classification Search ............ 365/185.22, 365/185.2, 185.18, 189.11
See application file for complete search history.

(56) References Cited

U.S. PATENT DOCUMENTS

| | | | | |
|---|---|---|---|---|
| 6,907,497 | B2 * | 6/2005 | Hosono et al. | ............... 711/103 |
| 7,149,110 | B2 * | 12/2006 | Tran et al. | ............... 365/185.03 |
| 7,170,780 | B2 * | 1/2007 | Kawai | ............... 365/185.03 |

FOREIGN PATENT DOCUMENTS

| | | |
|---|---|---|
| JP | 01-173494 | 7/1989 |
| JP | 2000-268593 | 9/2000 |
| KR | 2004-0008529 | 1/2004 |

OTHER PUBLICATIONS

English language abstract of Japanese Publication No. 01-173494.
English language abstract of Japanese Publication No. 2000-268593.
English language abstract of Korean Publication No. 2004-0008529.

* cited by examiner

*Primary Examiner*—Son Dinh
(74) *Attorney, Agent, or Firm*—F. Chau & Associates, LLC

(57) ABSTRACT

A non volatile memory device and method of operating including providing a verification voltage to a gate of a selected memory cell within multiple memory cells and providing a first pass voltage to a gate of a non-selected memory cell within the memory cells during a program verification operation; and providing a read voltage to the gate of the selected memory cell and providing a second pass voltage to the gate of the non-selected memory cell during a read operation. The second pass voltage is greater than the first pass voltage.

19 Claims, 12 Drawing Sheets

NON-VOLATILE MEMORY DEVICE AND METHOD OF OPERATING

CROSS-REFERENCE TO RELATED PATENT APPLICATION

This application claims the benefit of Korean Patent Application No. 10-2007-0059696, filed on Jun. 19, 2007, in the Korean Intellectual Property Office, the disclosure of which is incorporated herein in its entirety by reference.

TECHNICAL FIELD

This disclosure relates to a non-volatile memory device, and more particularly, to a non-volatile memory device for increasing a read margin of a memory cell by improving a back pattern dependency (BPD) effect, and a program and read method of operating the same.

BACKGROUND

FIG. 1 illustrates a memory cell array 10 of a conventional NAND-type non-volatile memory device. Referring to FIG. 1, the memory cell array 10 includes a bitline BLn, a plurality of wordlines WL0 through WLn, a string selection line SSL, a ground selection line GSL, a common source line CSL, a string selection transistor SST, a ground selection transistor GST, and multiple memory cells MC0 through MCn.

The string selection transistor SST is connected with the bitline BLn and is controlled by the string selection line SSL. The ground selection transistor GST is connected with the common source line CSL and is controlled via the ground selection line GSL.

The wordlines WL0 through WLn are respectively connected with gates of the memory cells MC0 through MCn and apply control voltages to the respective memory cells MC0 through MCn. The memory cells MC0 through MCn are connected in series between the string selection transistor SST and the ground selection transistor GST, forming a single string.

Usually, the non-volatile memory device like a flash memory can electrically read, program and erase data within the memory cells MC0 through MCn. The programming is an operation of recording data in each of the memory cells MC0 through MCn. To verify whether data has been normally programmed at each memory cell, a program verification operation is needed when each of the memory cells MC0 through MCn is programmed.

FIGS. 2A and 2B are diagrams for explaining voltages applied to the memory cells MC0 through MCn illustrated in FIG. 1 according to different operation modes. FIG. 3 is a graph illustrating the variation of threshold voltage of the memory cells MC0 through MCn illustrated in FIG. 1. FIG. 4A is a circuit diagram for conceptually explaining current change in the memory cells MC0 through MCn illustrated in FIG. 1 in different operation modes. FIG. 4B is a graph illustrating current changes in the memory cells MC0 through MCn illustrated in FIG. 1 in different operation modes.

Generally, in program verification, data can be read by applying a verification voltage Vvfy (i.e., Vvfy1, Vvfy2, or Vvfy3) to a selected memory cell (hereinafter, referred to as a selected cell) and detecting a current flowing in the selected cell. At this time, a high pass voltage Vread having a predetermined high level is applied to the other non-selected memory cells (hereinafter, referred to as non-selected cells). In a read operation, data can be read by applying a read voltage Vr1 or Vr2 to a selected cell and detecting a current flowing in the selected cell. At this time, the high voltage Vread having the predetermined voltage level is applied to the other non-selected cells.

Referring to FIGS. 2A and 2B, the memory cells MCi are sequentially programmed from the bottom cell to the top cell. FIG. 2A illustrates a voltage applied to the wordlines WL0 through WLn during the program verification after the selected cell, i.e., the bottom cell is programmed to "01". FIG. 2B illustrates a voltage applied to the wordlines WL0 through WLn when the read operation is performed on the selected cell after the other non-selected cells are all programmed to "00".

As illustrated in FIGS. 2A and 2B, when the non-selected cells are in an erase state "11" in the program verification and are programmed to "00" in the read operation, a threshold voltage of the non-selected cells in the program verification has a different level than that in the read operation. In other words, the non-selected cells have a lowest threshold voltage Vth0 among threshold voltages Vth0, Vth1, Vth2, and Vth3 during the program verification while they have a highest threshold voltage Vth3 during the read operation. Since the threshold voltage increases due to the change in data patterns of the non-selected cells, for example, from "11" to "00", a channel resistance Rafter of the non-selected cells during the read operation is higher than a channel resistance Rinitial of the non-selected cells during the program verification. Accordingly, when the same high voltage Vread is applied to the non-selected cells during both of the program verification and the read operation, an on-cell current Icell' or off-cell current Ioffcell' flowing in the selected cell during the read operation is lower than an on-cell current Icell or off-cell current Ioffcell flowing in the selected cell during a program operation. Referring to FIG. 4B, the change in the off-cell current, i.e., the change from Ioffcell to Ioffcell' is slight as is shown in graph (b), but the change in the on-cell current, i.e., the change from Icell to Icell' can be big as is shown in graph (a).

In other words, when the selected cell is an on-cell, the current Icell' flowing in the selected cell during the read operation can be significantly decreased from the current Icell flowing in the selected cell during the program verification. The on-cell indicates a memory cell, in which a threshold voltage is lowered (for example, to 0V or less) after electrons escape from a floating gate of a memory cell transistor, and is also referred to as an "erased cell". Contrarily, the off-cell indicates the memory cell having a high threshold voltage after electrons are accumulated at the floating gate of the memory cell transistor and is also referred to as a "programmed cell".

That the current Icell' of the selected cell during the read operation is lower than the current Icell of the selected cell during the program verification means that the variation of threshold voltage of the selected cell during the read operation is different from that during the program verification. Referring to FIG. 3, right after data "01" is programmed to the selected cell, the variation of threshold voltage of the selected cell can be expressed in a curve L1. However, during the read operation on the selected cell, the channel resistance in the non-selected cells increases, and therefore, the variation of threshold voltage of the selected cell can change. At this time, the selected cell can have a wider variation of threshold voltage as expressed in a curve L2. As the variation of threshold voltage of the selected cell is widened, a read margin can be decreased.

The read margin is a gap between the threshold voltage (e.g., Vth1) and the read voltage (e.g., Vr1). The read margin has influence on detecting a memory cell as an on-cell (FIG.

4A) or an off-cell (FIG. 4B). However, when the threshold voltage of an off-cell (or a programmed cell) increases, a current flowing in the selected cell is decreased as illustrated in FIGS. 4A and 4B. As a result, the read margin is decreased and it can become difficult to discriminate on-cells from off-cells, potentially causing read errors.

As described above, the change in a data pattern of non-selected cells between the program verification and the read operation causes a channel resistance of the non-selected cells to change, and therefore, a current flowing in a selected cell is decreased. As a result, the read margin can be decreased. This phenomenon is a sort of back pattern dependency (BPD) effect where the selected cell is adversely affected by the non-selected cells.

Therefore, a non-volatile memory device for increasing the read margin of a memory cell by improving the BPD effect is desired.

SUMMARY

An embodiment includes a method of operating a non-volatile memory device including providing a verification voltage to a gate of a selected memory cell within multiple memory cells and providing a first pass voltage to a gate of a non-selected memory cell within the memory cells during a program verification operation; and providing a read voltage to the gate of the selected memory cell and providing a second pass voltage to the gate of the non-selected memory cell during a read operation. The second pass voltage is greater than the first pass voltage.

Another embodiment includes a non-volatile memory device including wordlines; a bitline; multiple memory cells connected to the bitline, each memory cell connected to a corresponding one of the wordlines; a high voltage generator connected to the wordlines and configured to generate a verification voltage, a read voltage, a first pass voltage, and a second pass voltage; and a voltage selector coupled to the high voltage generator and the wordlines. The voltage selector is configured to provide a verification voltage to a gate of a selected memory cell within a plurality of memory cells and providing a first pass voltage to a gate of a non-selected memory cell within the memory cells during a program verification operation; and provide a read voltage to the gate of the selected memory cell and providing a second pass voltage to the gate of the non-selected memory cell during a read operation. The second pass voltage is greater than the first pass voltage.

BRIEF DESCRIPTION OF THE DRAWINGS

The above and other features and advantages will become more apparent by describing embodiments in detail with reference to the attached drawings in which.

DETAILED DESCRIPTION

Figure 1:
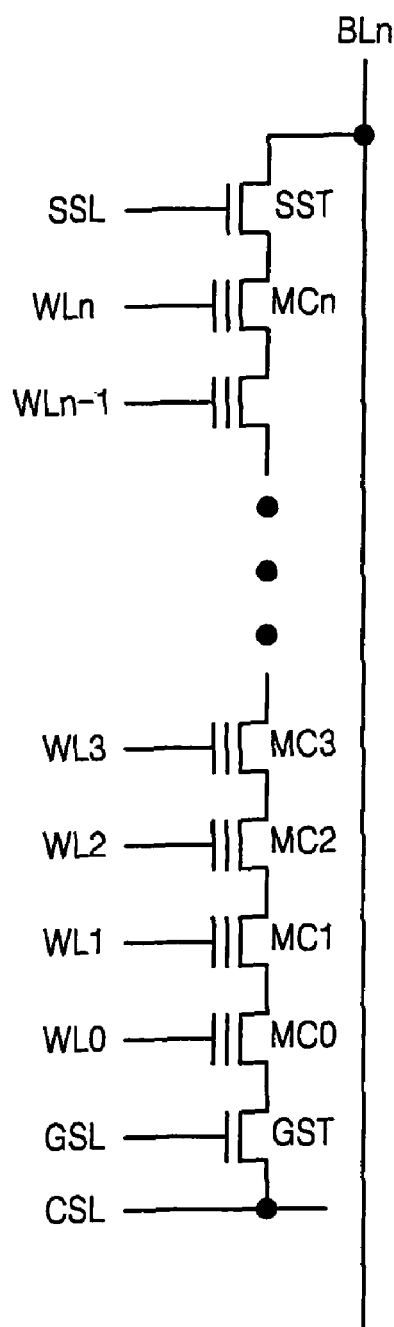
FIG. 1 illustrates a memory cell array of a conventional NAND-type non-volatile memory device.
Figure 2A:
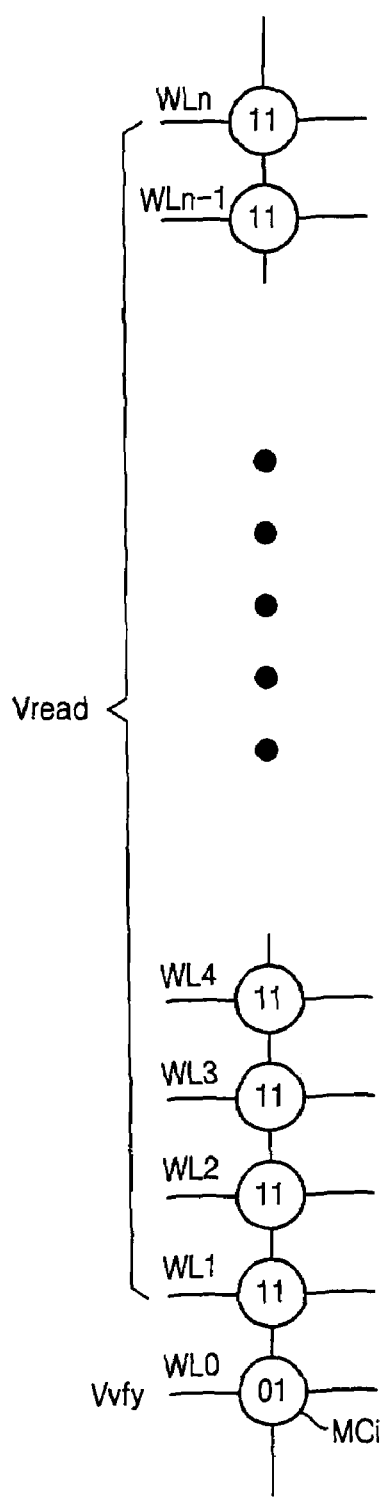
FIGS. 2A and 2B are diagrams for explaining voltages applied to memory cells illustrated in FIG. 1 in different operation modes.
Figure 2B:
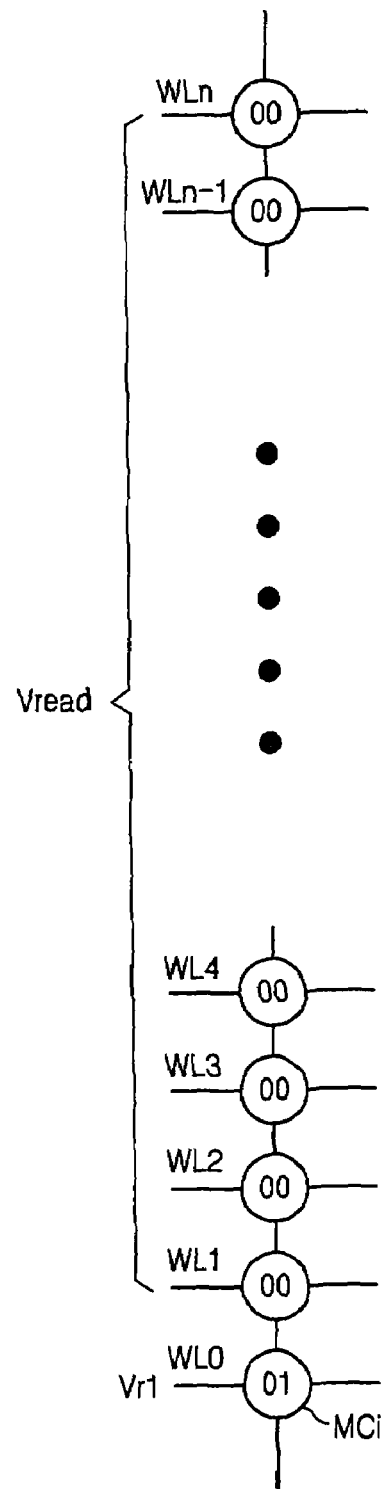
Figure 3:
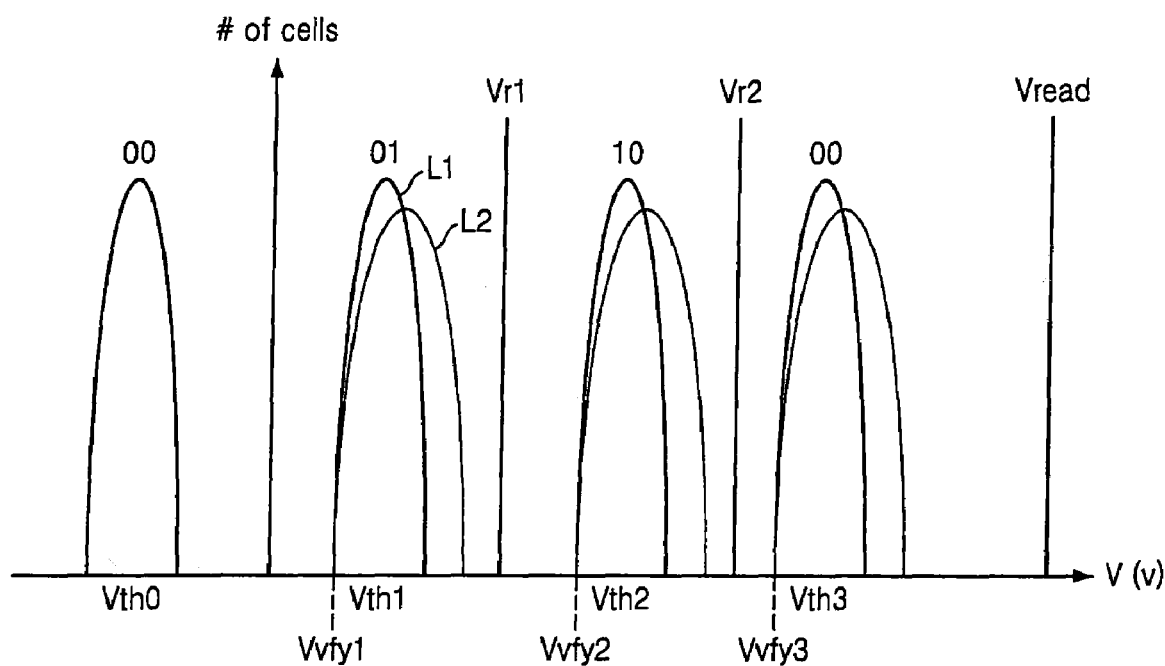
FIG. 3 is a graph illustrating the variation of threshold voltage of the memory cells illustrated in FIG. 1.

Embodiments will be described more fully hereinafter with reference to the accompanying drawings. Embodiments can, however, take many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 5:
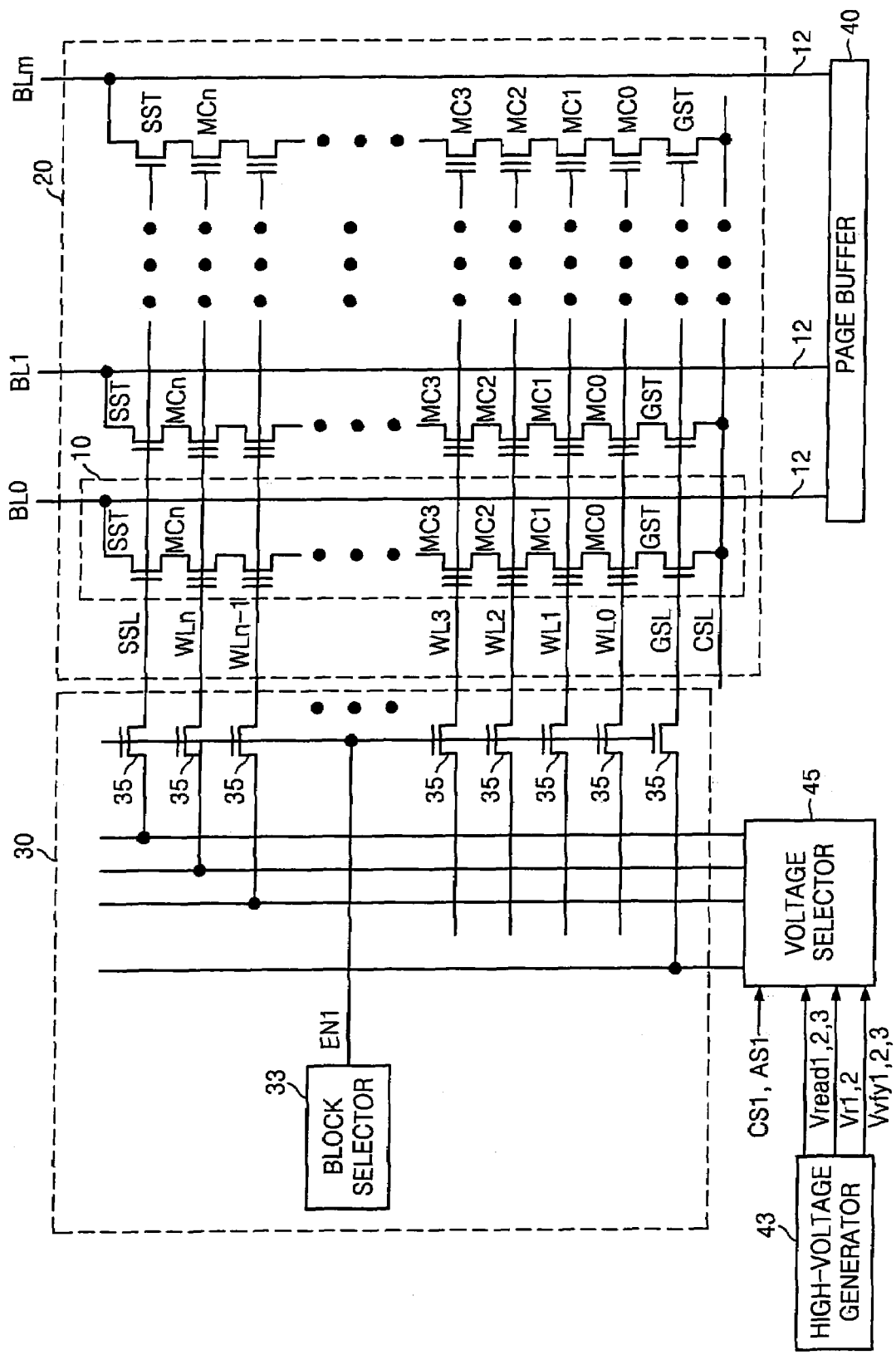
FIG. 5 is a schematic block diagram of a non-volatile memory device according to an embodiment.

FIG. 5 is a schematic block diagram of a non-volatile memory device according to an embodiment. The non-volatile memory device illustrated in FIG. 5 is a NAND-type flash memory device. Referring to FIG. 5, the non-volatile memory device includes a memory cell block 20, a row decoder 30, a page buffer 40, a high voltage generator 43, and a voltage selector 45. Although not shown, the non-volatile memory device can further include a control circuit, a clock signal generator, an address buffer, a column decoder, or the like.

The page buffer 40 is connected with the memory cell block 20 via bitlines BL0 through BLm. In addition, the page buffer 40 is configured to detect and temporarily store data that is read from memory cells MC0 through MCn connected with wordlines WL0 through WLn and output via the bitlines BL0 through BLm, respectively.

The row decoder 30 includes a block selector 33 and a plurality of select transistors 35. The block selector 33 is configured to generate a block enable signal EN1 for selecting the memory cell block 20 based on an address signal. The block enable signal EN1 is applied to the gates of the select transistors 35 in common. Each of the select transistors 35 is configured to be turned on in response to the block enable signal EN1 so that voltages output from the voltage selector 45 are applied to the wordlines WL0 through WLn, a string selection line SSL, and a ground selection line GSL.

The memory cell block 20 includes a plurality of memory cell arrays 10. Each of the memory cell arrays 10 is connected to a corresponding one of bitlines BLj (where j=0 through m), the wordlines WL0 through WLn, the string selection line SSL, the ground selection line GSL, and a common source line CSL. Each of the memory cell arrays 10 includes a string selection transistor SST, and a ground selection transistor GST, and memory cells MC0 through MCn.

The string selection transistor SST is connected with a corresponding bitline among the bitlines BLj and is controlled via the string selection line SSL. The ground selection transistor GST is connected with the common source line GSL and is controlled via the ground selection line GSL.

The wordlines WL0 through WLn are respectively connected with the gates of the memory cells MC0 through MCn and respectively apply a control voltage to the memory cells MC0 through MCn. The memory cells MC0 through MCn are connected in series between the string selection transistor SST and the ground selection transistor GST, forming a single string. The number (n+1) of the memory cells MC0 through MCn forming a single string can be 16, 32, 64, or the like according to the particular memory device.

The high voltage generator 43 is configured to generate multiple high voltages necessary to perform a program operation, an erase operation, and a read operation on memory cells. In an embodiment, the high voltage generator 43 can be implemented by a charge pump that pumps a reference voltage. The high voltages can include first through third verification voltages Vvfy1, Vvfy2, and Vvfy3, a first read voltage Vr1, a second read voltage Vr2, a first pass voltage Vread1, a second pass voltages Vread2, and a third pass voltage Vread3. However, the high voltage generator 43 can generate multiple high voltages in groups greater than three. For example, if the memory cells MC0 through MCn are eight level memory cells, rather than the four level memory cells as illustrated, the high voltage generator 43 can generate the high voltages in sets of seven. Using the verification voltages a an example, the high voltage generator 43 can be configured to generate first through seventh verification voltages Vvfy1, Vvfy2, . . . , and Vvfy7.

Figure 8:
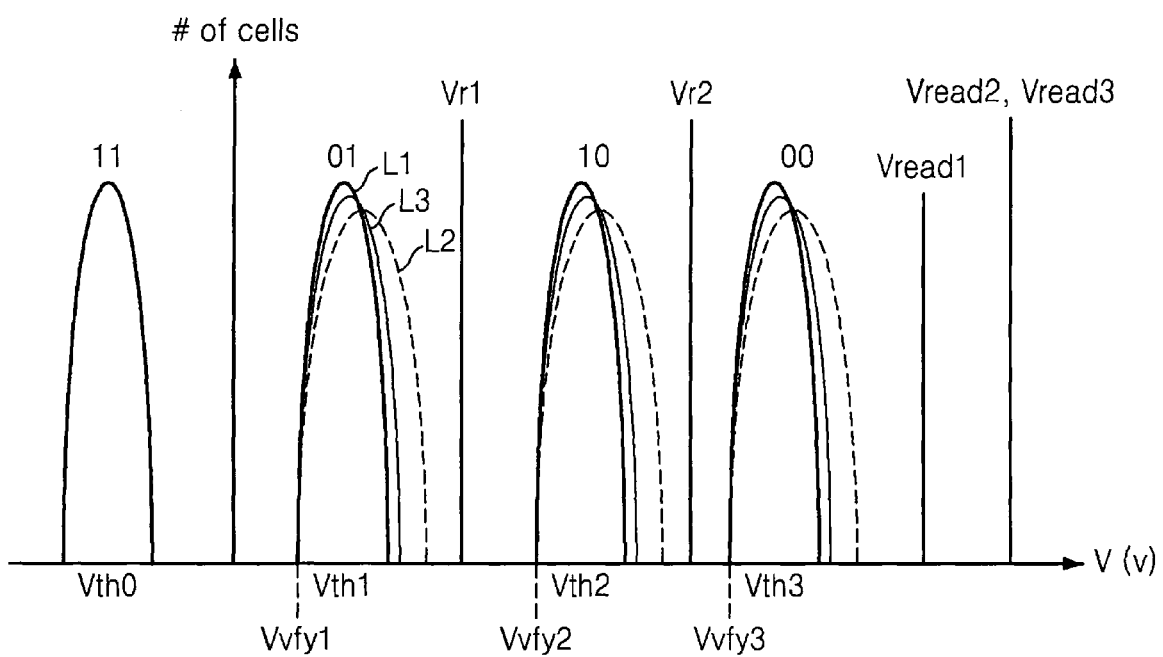
FIG. 8 is a graph illustrating the variation of threshold voltage of the memory cells illustrated in FIG. 5.

Voltages applied to a selected cell and non-selected cells in different operation modes will be described below with reference to FIG. 8, a graph illustrating the variation of threshold voltage of a multi-level memory cell. Referring to FIGS. 5 and 8, in an embodiment a memory cell is a multi-level memory cell that can store 2-bit data. The NAND-type non-volatile memory device illustrated in FIG. 5 can be implemented using multi-level cells in each of which 2-bit data is stored. The memory cell that can store 2-bit data, i.e., "11", "10", "01" and "00" can have four threshold voltage variations Vth0, Vth1, Vth2, and Vth3 as a result of the programming of the memory cell.

Generally, before data recording, the memory cells MC0 through MCn of the non-volatile memory device are initialized to a first level (e.g., "11") and the threshold voltages of the initialized memory cells MC0 through MCn can have a level, i.e. within threshold voltage variation Vth0. In an embodiment, the threshold voltages within the threshold voltage variation Vth0 can be negative.

Once data has been programmed, the programming of the data can be verified. In program verification, the first, second, or third verification voltage Vvfy1, Vvfy2, or Vvfy3 is applied to the selected cell and the first pass voltage Vread1 is applied to the non-selected cells. The verification voltage applied to the selected cell can be the first, second, or third verification voltage Vvfy1, Vvfy2, or Vvfy3 according to which of the states "10", "01", and "00" the selected cell is programmed to.

According to an embodiment, in the program verification, the verification voltage Vvfy1, Vvfy2, or Vvfy3 can be applied to the selected cell while the first pass voltage Vread1 is applied to the non-selected cells. In this case, in a read operation, the first or second read voltage Vr1 or Vr2 can be applied to the selected cell while the second pass voltage Vread2 higher than the first pass voltage Vread1 can be applied to the non-selected cells. These operations will be described in detail with reference to FIGS. 6A and 6B later.

According to an embodiment, in the program verification, the verification voltage Vvfy1, Vvfy2, or Vvfy3 can be applied to the selected cell while the first pass voltage Vread1 can be applied to a first group of non-selected cells connected to a drain of the selected cell among the non-selected cells and the third pass voltage Vread3 that is higher than the first pass voltage Vread1 can be applied to a second group of non-selected cells connected to a source of the selected cell among the non-selected cells. In this case, in the read operation, the first or second read voltage Vr1 or Vr2 can be applied to the selected cell while the second pass voltage Vread2 higher than the first pass voltage Vread1 can be applied to the non-selected cells. The second pass voltage Vread 2 and the third pass voltage Vread3 can be the same. These operations will be described in detail with reference to FIGS. 7A through 7C later.

In an embodiment, the first read voltage Vr1 can be a voltage that is applied to the selected cell when data stored in the selected cell is "01". The second read voltage Vr2 can be a voltage that is applied to the selected cell when data stored in the selected cell is "10".

In an embodiment, the first pass voltage Vread1 can vary with a place of the selected memory in a string. The variable first pass voltage Vread1 will be described in detail with reference to FIGS. 6A through 7C later.

The voltage selector 45 is configured to receive the high voltages Vvfy1, Vvfy2, Vvfy3, Vr1, Vr2, Vread1, Vread2, and Vread3 output from the high voltage generator 43 and selectively output the high voltages to the wordlines WL0 through WLn, the string selection line SSL, and the ground selection line GSL in response to a first address signal AS1 and a first control signal CS1 according to operation modes. The first address signal AS1 can be output from an address buffer (not shown), an address decoder (not shown), or the like. The first control signal CS1 can be output from a controller (not shown), which can read a command signal, determine an operation mode of the non-volatile memory device based on the command signal, generate control signals according to the operation mode, or the like. In an embodiment, the operation mode can be a program operation, a program verification operation, a read operation, or an erase operation.

In the read operation, data stored in the memory cells MC0 through MCn is read. In the program verification operation, it is verified whether a selected cell MCi has been programmed to a desired threshold voltage through the program operation. The read operation and the program verification operation have different purposes; however the operation can be substantially similar. The non-volatile memory device can repeat the program operation and the program verification operation until the selected cell MCi is programmed satisfactorily.

Figure 6A:
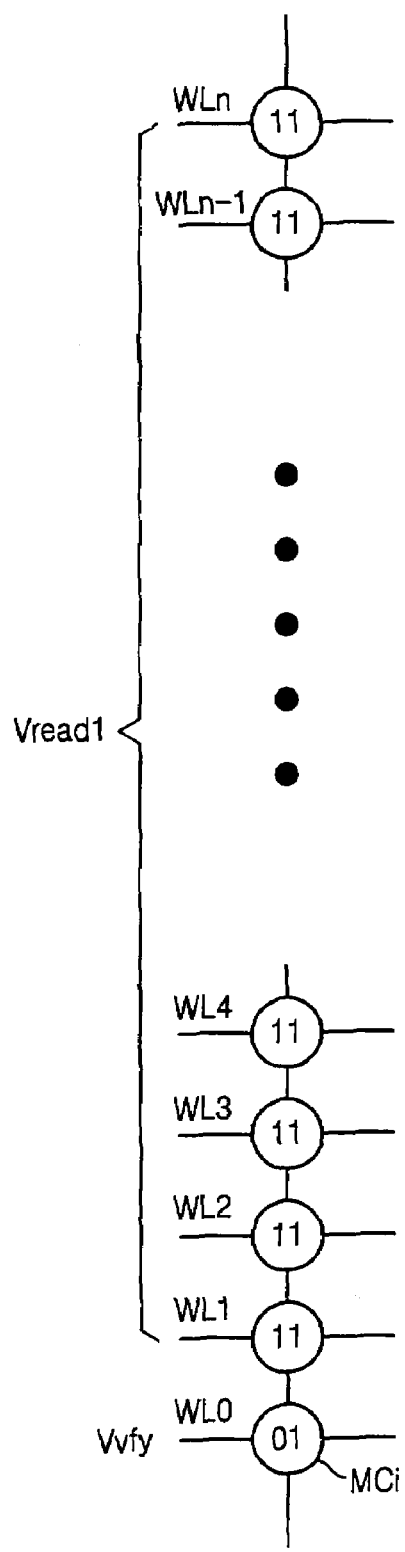
FIGS. 6A and 6B are diagrams for conceptually explaining voltages applied to memory cells illustrated in FIG. 5 in different operation modes according to various embodiments.
Figure 6B:
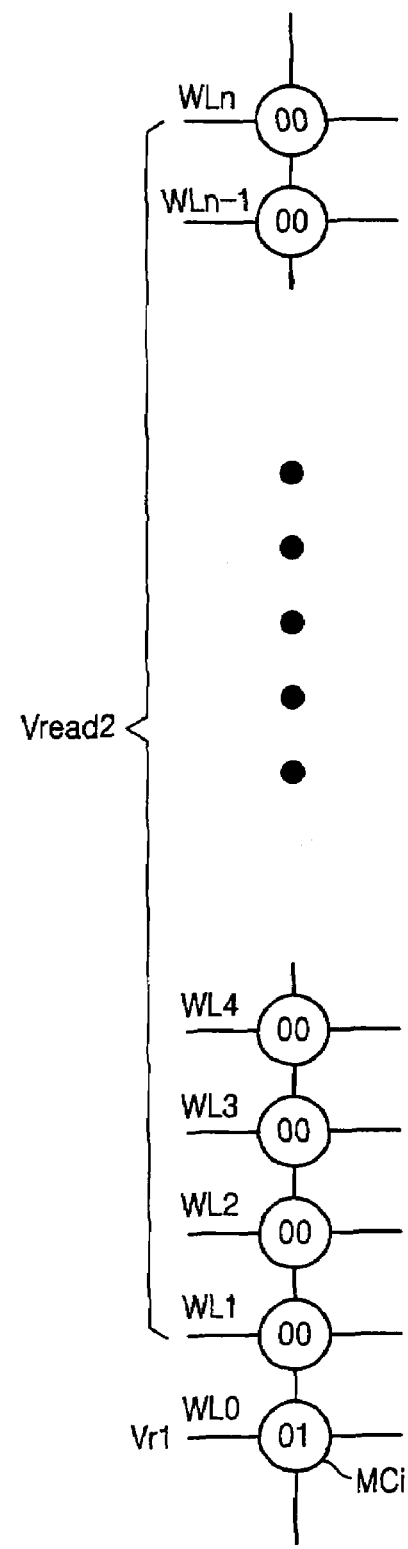
Figure 7A:
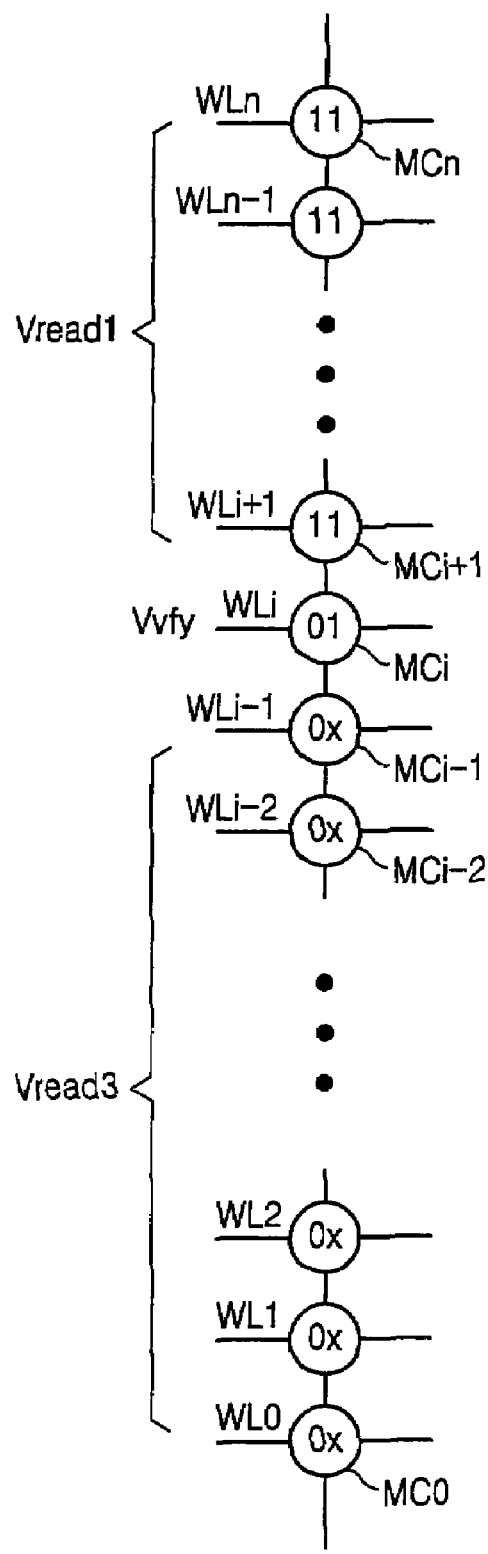
FIGS. 7A through 7C are diagrams for conceptually explaining voltages applied to the memory cells illustrated in FIG. 5 in different operation modes according to various embodiments.
Figure 7B:
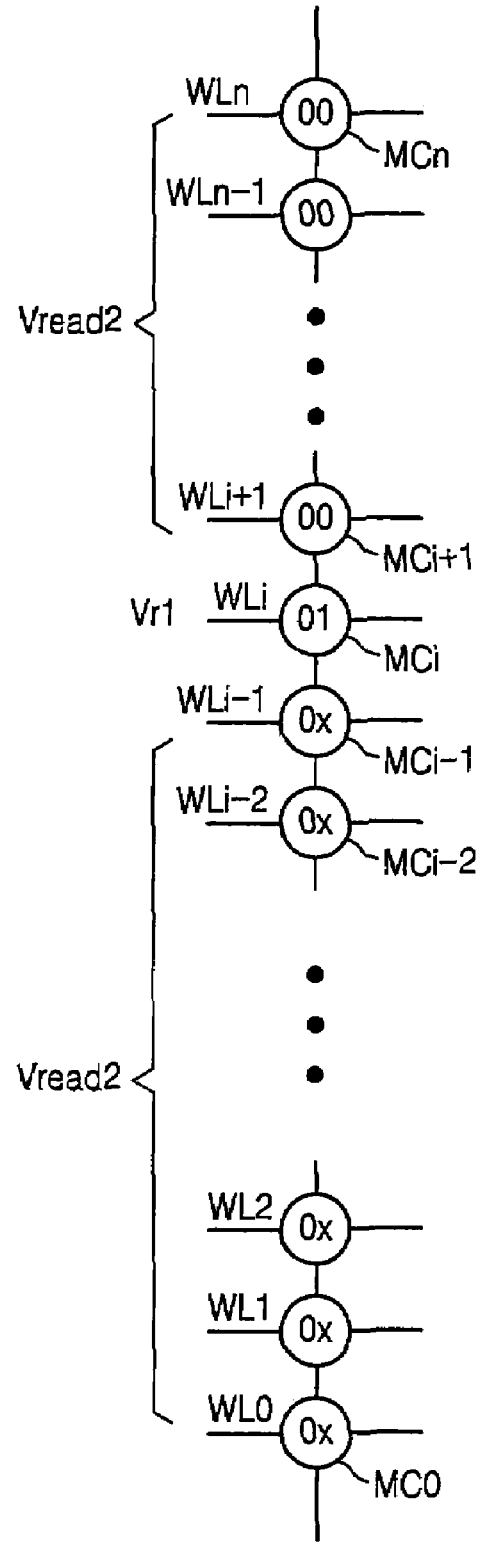
Figure 7C:
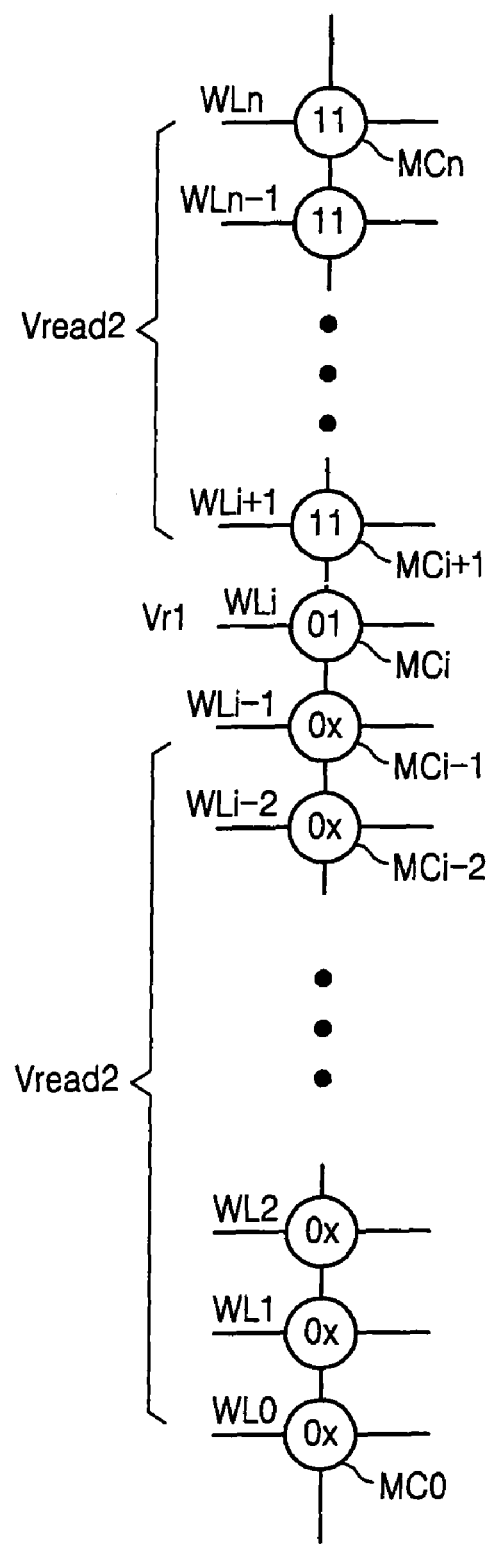

FIGS. 6A and 6B are diagrams for conceptually explaining voltages applied to memory cells illustrated in FIG. 5 in different operation modes according to some embodiments of the present invention. FIGS. 7A through 7C are diagrams for conceptually explaining voltages applied to the memory cells illustrated in FIG. 5 in different operation modes according to other embodiments. In FIGS. 6A through 7C, a string in which the first memory cell MC0 through the (n+1)-th memory cell MCn are connected in series is illustrated. It is assumed that the memory cells MC0 through MCn are programmed sequentially from the first memory cell MC0 to the (n+1)-th memory cell MCn.

FIGS. 6A and 6B illustrate voltage conditions for the program verification operation and voltage conditions for the read operation when the selected memory cell MCi is the first memory cell MC0 in the string, that is, when i=1. Referring to FIGS. 5 and 6A, in the program verification operation, the voltage selector 45 outputs the verification voltage Vvfy1 to the wordline WL0 connected with the selected cell MC0 storing data "01" and outputs the first pass voltage Vread to the wordlines WL1 through WLn connected with the non-selected cells MC1 through MCn. When the first memory cell MC0 is selected and programmed to predetermined data, for example, "01", and the programmed cell MC0 is verified, the second through (n+1)-th memory cells MC1 through MCn are still in the initial state "11" before the program operation.

Referring to FIGS. 5 and 6B, in the read operation, the voltage selector 45 outputs the first read voltage Vr1 to the wordline WL0 of the selected memory cell MC0 and outputs the second pass voltage Vread2 having a higher level than the first pass voltage Vread1 to the "n" non-selected wordlines WL1 through WLn. The read operation can be performed after all of the memory cells MC0 through MCn are programmed. When the second through (n+1)-th memory cells MC1 through MCn are programmed to data (e.g., "00") having the highest threshold voltage, a difference between a channel resistance of the non-selected cells MC1 through MCn during the program verification operation on the selected cell MC0 and a channel resistance of the non-selected cells MC1 through MCn during the read operation can be the greatest.

Accordingly, in an embodiment, the first pass voltage Vread1 applied to the non-selected cells MC1 through MCn during the program verification operation is lower than the second pass voltage Vread2 applied to the non-selected cells MC1 through MCn during the read operation. As a result, the difference between the channel resistance of the non-selected cells MC1 through MCn during the program verification operation and the channel resistance of the non-selected cells MC1 through MCn during the read operation can be reduced. As a result, a back pattern dependency (BPD) effect can be improved.

FIGS. 7A through 7C illustrates voltage conditions for the program verification operation and voltage conditions for the read operation when the selected memory cell MCi is any one of the memory cells MC0 through MCn except for the first and last memory cells MC0 and MCn in the string according to a variety of embodiments. Referring to FIG. 7A, the non-selected cells can be divided into first group non-selected cells (or non-selected first group memory cells) MCi+1 through MCn that are erased cells before being programmed and second group non-selected cells (or non-selected second group memory cells) MC0 through MCi−1 that have been programmed with data. The first group non-selected cells MCi+1 through MCn include (n−i) memory cells connected to a drain of the selected cell MCi and the second group non-selected cells MC0 through MCi−1 include (i−1) memory cells connected to a source of the selected cell MCi.

During the program verification operation of selected cell MCi, the first group non-selected cells MCi+1 through MCn are in a pre-program state in which they are not programmed. During the read operation of selected cell MCi, the first group non-selected cells MCi+1 through MCn are in a post-program state in which they have been programmed. Therefore, they have different threshold voltages in the different operations, causing their channel resistance to change. The change in the channel resistance influences the selected cell MCi. In contrast, since the second group non-selected cells MC0 through MCi−1 are in the post-program state during both of the program verification operation and the read operation, they rarely or slightly influences the selected cell MCi. Accordingly, the first pass voltage Vread1 can be applied to gates of the first group non-selected cells MCi+1 through MCn and the third pass voltage Vread3 can be applied to gates of the second group non-selected cells MC0 through MCi−1 where the first pass voltage Vread1 is different from Vread3.

In detail, during the program verification operation, the voltage selector 45 is configured to provide the verification voltage Vvfy to the wordline WLi of the selected cell MCi, i.e., a gate of the selected cell MCi, in response to the first control signal CS1 and the address signal AS1. In addition, the voltage selector 45 is configured to provide the first pass voltage Vread1 to the gates of the first group non-selected cells MCi+1 through MCn and provides the third pass voltage Vread3 that is higher than the first pass voltage Vread1 to the gates of the second group non-selected cells MC0 through MCi−1.

During the read operation, the voltage selector 45 is configured to provide the first read voltage Vr1 to the wordline WLi of the selected cell MCi. In addition, the voltage selector 45 provides the second pass voltage Vread2 to the wordlines WLi+1 through WLn of the first group non-selected cells MCi+1 through MCn and to the wordlines WL0 through WLi−1 of the second group non-selected cells MC0 through MCi−1 regardless of data programmed to the non-selected cells.

FIG. 7B illustrates voltage application during the read operation when all of the first group non-selected cells MCi+1 through MCn are programmed to "00". FIG. 7C illustrates voltage application during the read operation when all of the first group non-selected cells MCi+1 through MCn are programmed to "11".

In a case having the voltage application illustrated in FIG. 7B, the channel resistance of the non-selected cell between the program verification operation and the read operation can be different, but the difference in the channel resistance can be reduced by setting the first pass voltage Vread1 to be lower than the second pass voltage Vread2. As a result, the BPD effect is improved. The first pass voltage Vread1 can be a voltage that was determined through experiments or simulation such that the channel resistance of the non-selected cells during the program verification operation is almost similar to that during the read operation.

Figure 9A:
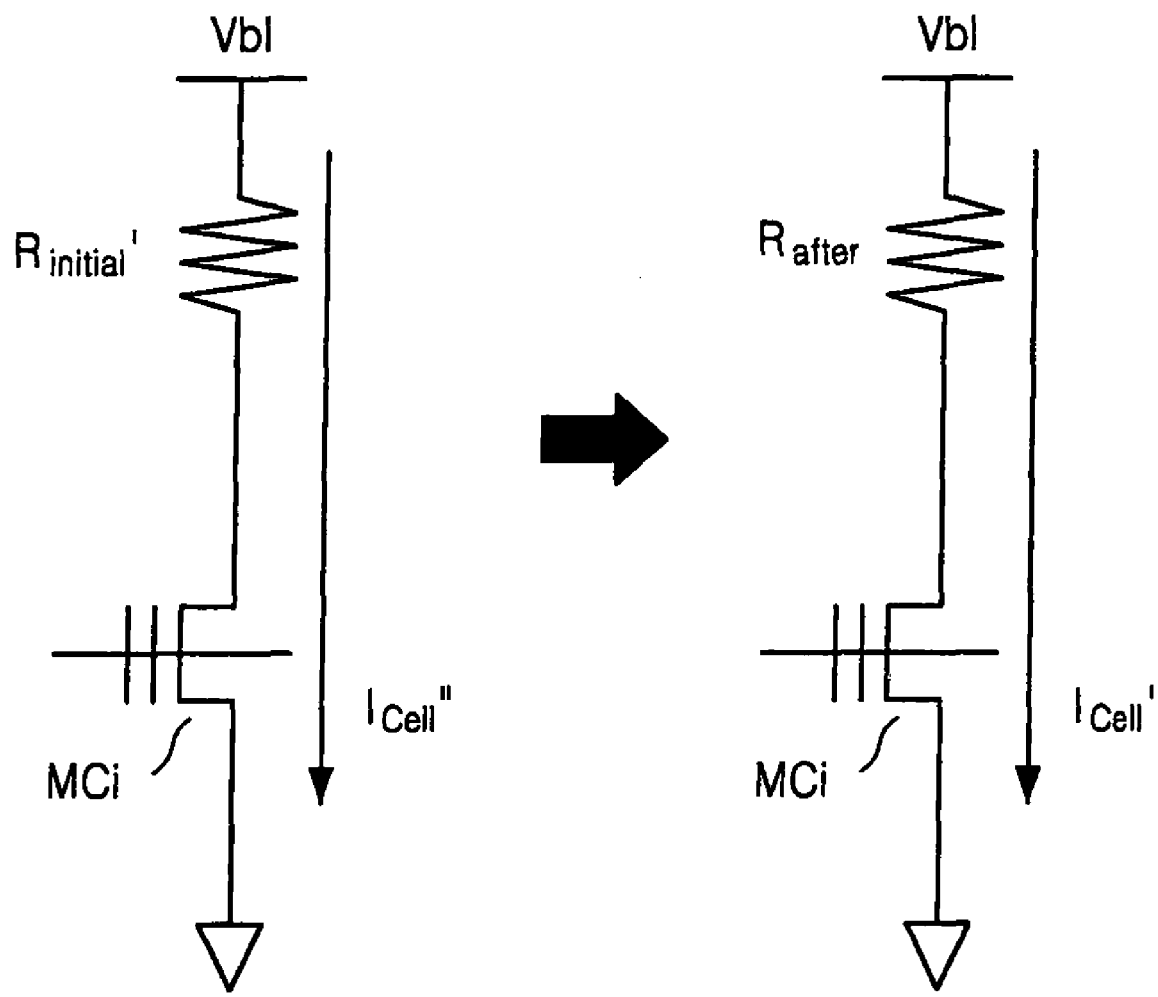
FIG. 9A is a circuit diagram for conceptually explaining current change in a memory cell in different operation modes according to an embodiment.
Figure 9B:
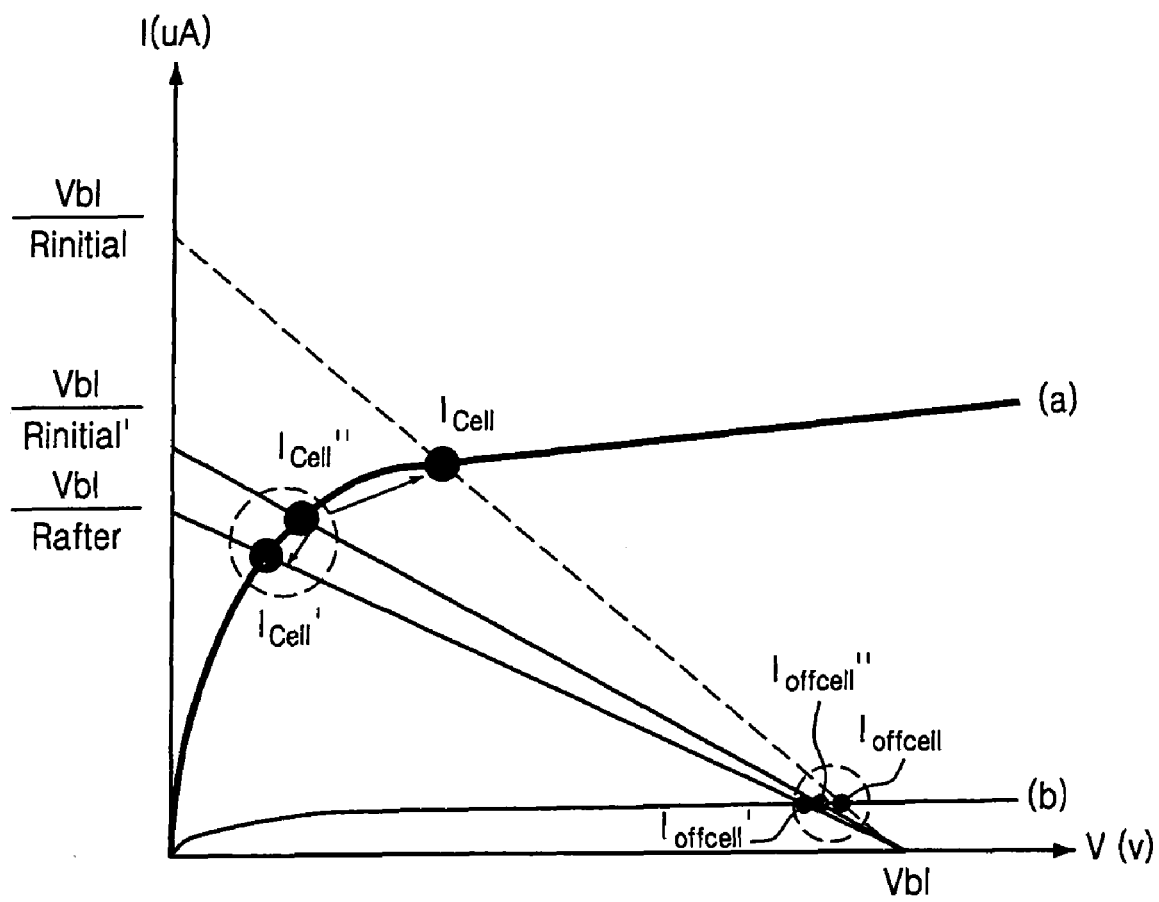
FIG. 9B is a graph illustrating current changes in memory cells in different operation modes according to an embodiment.

In a case having the voltage application as illustrated in FIG. 7C, the first group non-selected cells MCi+1 through MCn have the same data "11" during both of the program verification operation and the read operation and the second pass voltage Vread2 applied to the gates of the first group non-selected cells MCi+1 through MCn during the read operation is higher than the first pass voltage Vread1 applied to the gates of the first group non-selected cells MCi+1 through MCn during the program verification operation. Accordingly, the channel resistance of the non-selected cells during the read operation is decreased compared to that during the program verification operation, and therefore, on-cell current of the selected cell MCi during the read operation can be greater than that during the program verification operation. However, the greater on-cell current during the read operation can be an advantage in discriminating an on-cell from an off-cell and does not adversely affect the read margin. Meanwhile, off-cell current of the selected cell MCi can be increased during the read operation compared to the program verification operation, but the change in the off-cell current is very slight, as illustrated in FIG. 9B.

In an embodiment, the first pass voltage Vread1 can vary with the position of the selected cell MCi in the string, that is, "i" (i=0 through n). For instance, the first pass voltage Vread1 can be changed to be close the level of the second pass voltage Vread2 as the number (n–i) of non-selected first group memory cells is decreased.

Referring to FIGS. 6A through 7C, during the program verification operation, the first pass voltage Vread1 is applied to the wordlines of (n–1) non-selected cells in FIG. 6A and is applied to the wordlines of (n–i) first group non-selected cells in FIG. 7A. When the number (n–i) of first group non-selected cells is decreased, the channel resistance of the non-selected cells during the program verification operation can be similar to that during the read operation. That is, the number of first group non-selected cells with different channel resistances between the program verification and read operations decreases, decreasing the impact of the difference in channel resistance. Accordingly, the first pass voltage Vread1 can be changed to be closer to the level of the second pass voltage Vread2 as the number (n–i) of the first group non-selected cells is decreased.

In the examples illustrated in FIGS. 6A through 7C, the memory cells MC0 through MCn are programmed sequentially from the first memory cell MC0 to the (n+1)-th memory cell MCn. In another case where the memory cells MC0 through MCn are programmed sequentially from the (n+1)-th memory cell MCn to the first memory cell MC0, the first group non-selected memory cells can include (i–1) memory cells MC0 through MCi–1 connected to the source of the selected cell MCi and the second group non-selected cells can include (n–i) memory cells MCi+1 through MCn connected to the drain of the selected cell MCi. However, in an embodiment, any end of a string of memory cells can be referred to as a first memory cell.

FIG. 8 is a graph illustrating the variation of threshold voltage of memory cells according to an embodiment. FIG. 9A is a circuit diagram for conceptually explaining current change in a memory cell in different operation modes in an embodiment. FIG. 9B is a graph illustrating current changes in memory cells in different operation modes in an embodiment.

Referring to FIG. 9A, when a voltage applied to a non-selected cell (e.g., a first group non-selected cell before being programmed) during the program verification operation is decreased to be lower than a voltage applied to the non-selected cell during the read operation, a channel resistance Rinitial' of the non-selected cell during the program verification operation becomes similar to a channel resistance Rafter of the non-selected cell during the read operation. At this time, the channel resistance Rafter of the non-selected cell during the read operation can be the channel resistance of the non-selected cells in FIG. 7B. Accordingly, as illustrated in FIG. 9B, an on-cell current Icell' or an off-cell current Ioffcell' flowing in a selected cell during the read operation is respectively closer to an on-cell current Icell" or an off-cell current Ioffcell" flowing in the selected cell during the program verification operation. The on-cell current Icell' and the off-cell current Ioffcell' flowing in a selected cell during the read operation can be respectively similar to or have only a slight difference from the on-cell current Icell" or the off-cell current Ioffcell" flowing in the selected cell during the program verification operation. Accordingly, the read margin is not reduced.

In detail, in a case of transition from the conditions illustrated in FIG. 7A to the conditions illustrated in FIG. 7B, the first pass voltage Vread1 that is lower than the second pass voltage Vread2 is applied to non-selected cells during the program verification operation, so that a difference between the current Icell" flowing in the selected cell during the program verification operation and the current Icell' flowing in the selected cell during the read operation is reduced.

Figure 4A:
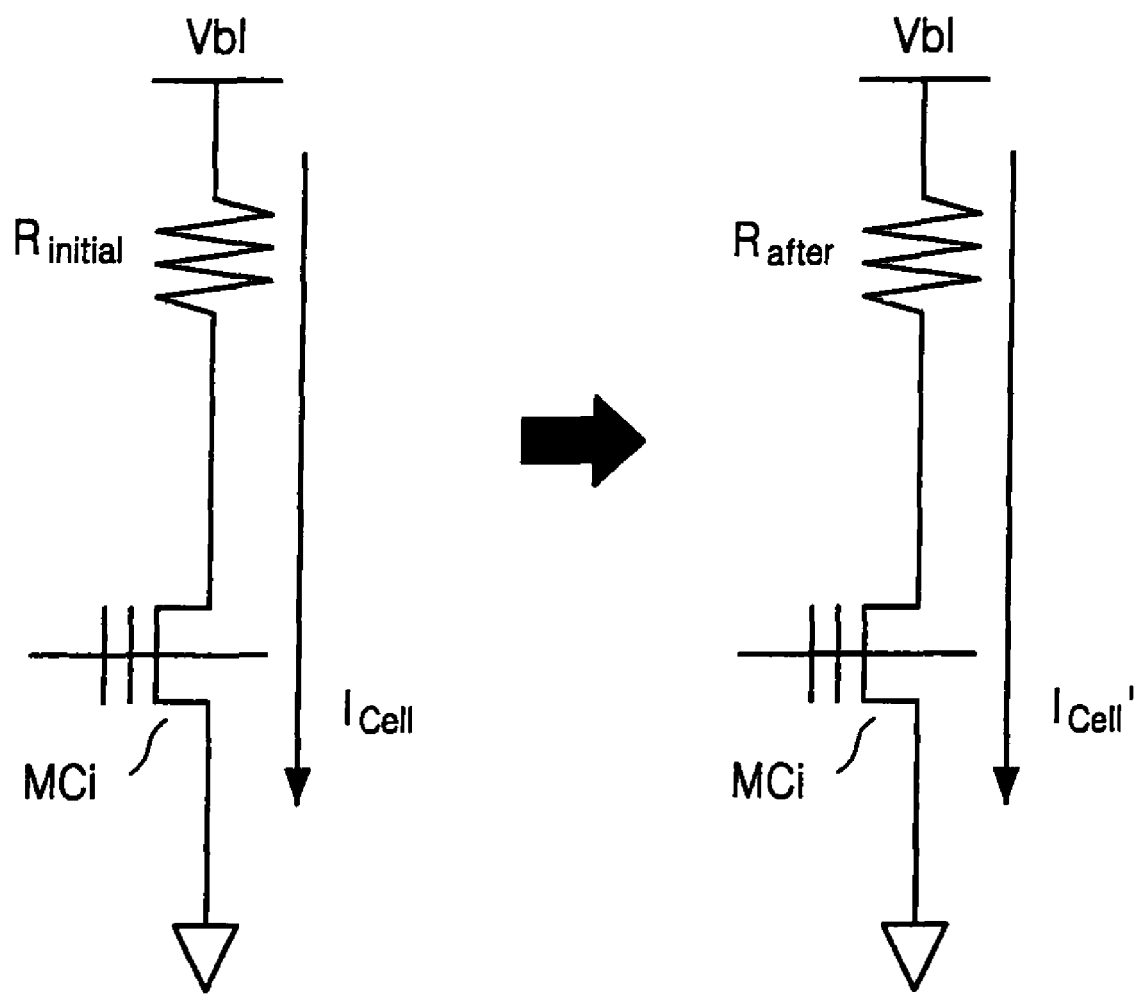
FIG. 4A is a circuit diagram for conceptually explaining current change in the memory cells illustrated in FIG. 1 in different operation modes.
Figure 4B:
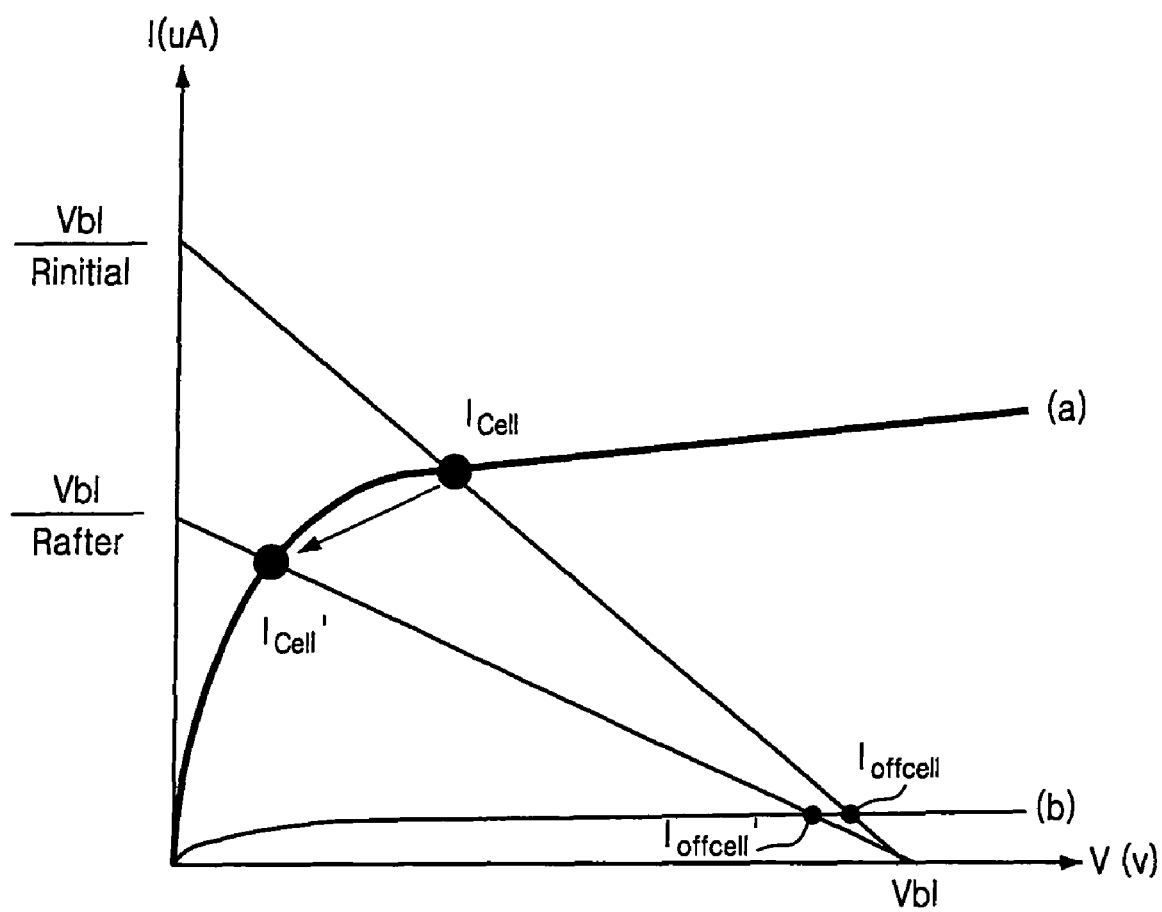
FIG. 4B is a graph illustrating current changes in the memory cells illustrated in FIG. 1 in different operation modes.

In another case of transition from the conditions illustrated in FIG. 7A to the conditions illustrated in FIG. 7C, the channel resistance of the non-selected cells during the read operation becomes similar to the channel resistance Rinitial illustrated in FIG. 4A. In this case, the channel resistance is decreased, so as illustrated in FIG. 9 the on-cell current Icell or the off-cell current Ioffcell flowing in the selected cell during the read operation can be much higher than the on-cell current Icell" or the off-cell current Ioffcell" flowing in the selected cell during the program verification operation. However, the increase of the on-cell current can bring increase of the read margin, which is an advantage in discriminating an on-cell from an off-cell.

When the selected cell is an off-cell, as illustrated in FIG. 9B, the off-cell current Ioffcell' or Ioffcell flowing in the selected cell during the read operation is just slightly different from the off-cell current Ioffcell" flowing in the selected cell during the program verification operation, and therefore, the difference therebetween can be ignored.

Referring to FIG. 8, right after data "01" is programmed to the selected cell, the variation of threshold voltage of the selected cell can be expressed in a curve L1 illustrated in FIG. 8. In the current embodiments of the present invention, a difference in channel resistance of non-selected cells between the program verification operation and the read operation is reduced, so that the influence of the non-selected cells on the selected cell, i.e., the BPD effect is decreased. Accordingly, the selected cell during the read operation can have the narrower variation of threshold voltage expressed in a curve L3 similar to the variation of threshold voltage of the selected cell during the program verification operation. Threshold variation L2 is illustrated for reference, showing an example where the same pass voltage is used for both the program verification and read operations.

An embodiment includes a non-volatile memory device for increasing a read margin of a memory cell by improving a back pattern dependency (BPD) effect by decreasing the change in channel resistance between a program verification and a read operation, and a method of operating the same.

An embodiment includes a method of operating a non-volatile memory device. The method includes providing a verification voltage to a gate of a selected memory cell and providing a first pass voltage to gates of non-selected first group memory cells during a program verification operation; and providing a read voltage to the gate of the selected memory cell and providing a second pass voltage having a higher level than the first pass voltage to gates of non-selected memory cells during a read operation. Here, the non-selected first group memory cells can be all or part of the non-selected memory cells.

The method further includes providing a third pass voltage having a higher level than the first pass voltage to gates of non-selected second group memory cells which do not overlap the non-selected first group memory cells during the program verification operation. The non-selected memory cells can include the non-selected first group memory cells and the non-selected second group memory cells.

In an embodiment, the non-volatile memory device can be a NAND-type flash memory device having a string in which first through N-th memory cells are connected in series where N is 2 or an integer greater than 2, and the selected memory cell can be an i-th memory cell in the string where "i" is an integer and $1 \leq i \leq N$.

When the memory cells are programmed sequentially from the first memory cell to the N-th memory cell, the non-selected first group memory cells can include a j-th memory cell in the string where "j" is an integer and $i<j \leq N$, and the non-selected second group memory cells can include a k-th memory cell in the string where "k" is an integer and $1 \leq k<i$.

When the memory cells are programmed sequentially from the N-th memory cell to the first memory cell, the non-selected first group memory cells can include a k-th memory cell in the string where "k" is an integer and $1 \leq k<i$, and the non-selected second group memory cells can include a j-th memory cell in the string where "j" is an integer and $i<j \leq N$.

In an embodiment, the first pass voltage can vary with a place of the selected memory cell in the string. The second pass voltage and the third pass voltage can have the same level.

The selected memory cell and the non-selected memory cells can be multi-level cells that can store multiple bits. The verification voltage can be one of at least two verification voltages having different levels and the read voltage can be one of at least two read voltages having different levels.

An embodiment includes a non-volatile memory device including multiple wordlines; multiple bitlines; a memory cell array from which data is read via the bitlines and which includes multiple memory cells, gates of which is connected with corresponding wordlines; a high voltage generator configured to generate a verification voltage, a read voltage, a first pass voltage, and a second pass voltage having a higher level than the first pass voltage; and a voltage selector configured to receive the verification voltage, the read voltage, the first pass voltage, and the second pass voltage from the high voltage generator, providing the verification voltage to a gate of a selected memory cell among the memory cells and the first pass voltage to gates of non-selected first group memory cells among the memory cells during a program verification operation, and providing the read voltage to the gate of the selected memory cell and the second pass voltage to non-selected memory cells among the memory cells during a read operation. Here, the non-selected first group memory cells can be all or part of the non-selected memory cells.

The high voltage generator can further generate a third pass voltage having a higher level than the first pass voltage. The voltage selector can provide the third pass voltage to gates of non-selected second group memory cells which do not overlap the non-selected first group memory cells during the program verification operation. The non-selected memory cells can include the non-selected first group memory cells and the non-selected second group memory cells.

The memory cells can include first through N-th memory cells connected in series on a string where N is 2 or an integer greater than 2. The selected memory cell can be an i-th memory cell in the string where "i" is an integer and $1 \leq i \leq N$.

When the memory cells are programmed sequentially from the first memory cell to the N-th memory cell, the non-selected first group memory cells can include a j-th memory cell in the string where "j" is an integer and $i<j \leq N$, and the non-selected second group memory cells can include a k-th memory cell in the string where "k" is an integer and $1 \leq k<i$.

When the memory cells are programmed sequentially from the N-th memory cell to the first memory cell, the non-selected first group memory cells can include a k-th memory cell in the string where "k" is an integer and $1 \leq k<i$, and the non-selected second group memory cells can include a j-th memory cell in the string where "j" is an integer and $i<j \leq N$.

As described above, the change of current flowing in a selected cell between a program verification operation and a read operation can be reduced by decreasing a difference between a channel resistance of non-selected cells during the program verification operation and a channel resistance of the non-selected cells during the read operation. Accordingly, a read margin is satisfactorily secured and the data reliability of a non-volatile memory device is increased.

While embodiments have been particularly shown and described with reference to the drawings, it will be understood by those of ordinary skill in the art that various changes in forms and details can be made therein without departing from the spirit and scope of the present invention as defined by the following claims.

What is claimed is:

1. An method of operating a non-volatile memory device, the method comprising:
   providing a verification voltage to a gate of a selected memory cell within a plurality of memory cells and providing a first pass voltage to a gate of a non-selected memory cell within the memory cells during a program verification operation; and
   providing a read voltage to the gate of the selected memory cell and providing a second pass voltage to the gate of the non-selected memory cell during a read operation;
   wherein the second pass voltage is greater than the first pass voltage.

2. The method of claim 1, further comprising providing the first pass voltage to gates of all non-selected memory cells of the memory cells during the program verification operation.

3. The method of claim 1, the non-selected memory cell referred to as a first non-selected memory cell, the method further comprising:

providing a third pass voltage to a gate of a second non-selected memory cell of the memory cells during the program verification operation;
wherein the third pass voltage is greater than the first pass voltage.

4. The method of claim 3, wherein the second pass voltage and the third pass voltage have the same level.

5. The method of claim 3, wherein:
non-selected memory cells of the memory cells are grouped into a first group of non-selected memory cells and a second group of non-selected memory cells; and
further comprising:
providing the first pass voltage to gates of the first group of non-selected memory cells during the program verification operation; and
providing the third pass voltage to gates of the second group of non-selected memory cells during the program verification operation.

6. The method of claim 5, wherein:
the memory cells form a string of serially connected memory cells; and
the selected memory cell is disposed in the string between the first group of non-selected memory cells and the second group of non-selected memory cells.

7. The method of claim 1, wherein the memory cells form a string of a NAND-type flash memory device in which first through N-th memory cells are connected in series where the selected memory cell is an i-th memory cell in the string where "i" is an integer and $1 \leqq i \leqq N$, the method comprising:
sequentially programming the memory cells from the first memory cell to the N-th memory cell; and
when verifying the i-th memory cell, providing the first pass voltage to j-th through the N-th memory cells during the program verification operation where "j" is an integer and $i < j \leqq N$.

8. The method of claim 7, further comprising when verifying the i-th memory cell, providing a third pass voltage to the first through k-th memory cells during the program verification operation where "k" is an integer and $1 \leqq k < i$.

9. The method of claim 1, wherein:
the memory cells form a string; and
the first pass voltage is based on a place of the selected memory cell in the string.

10. The method of claim 9, wherein a difference between the first pass voltage and the second pass voltage varies according to a number of non-selected memory cells between the selected memory cell and an end of the string.

11. The method of claim 1, wherein:
each of the memory cells are multi-level cells that can store multiple bits;
the verification voltage is one of a plurality of verification voltages having different levels; and
the read voltage is one of a plurality of read voltages having different levels.

12. The method of claim 1, wherein the first pass voltage is greater than the verification voltage and the read voltage.

13. A non-volatile memory device comprising:
a plurality of wordlines;
a bitline;
a plurality of memory cells connected to the bitline, each memory cell connected to a corresponding one of the wordlines;
a high voltage generator connected to the wordlines and configured to generate a verification voltage, a read voltage, a first pass voltage, and a second pass voltage; and
a voltage selector coupled to the high voltage generator and the wordlines, the voltage selector configured to:
provide the verification voltage to a gate of a selected memory cell within the plurality of memory cells and providing the first pass voltage to a gate of a non-selected memory cell within the memory cells during a program verification operation; and
provide the read voltage to the gate of the selected memory cell and providing the second pass voltage to the gate of the non-selected memory cell during a read operation;
wherein the second pass voltage is greater than the first pass voltage.

14. The non-volatile memory device of claim 13, wherein:
the high voltage generator is further configured to generate a third pass voltage that is greater than the first pass voltage; and
the voltage selector is configured to provide the third pass voltage to gates of the memory cells that are already programmed during the program verification operation.

15. The non-volatile memory device of claim 14, wherein the second pass voltage and the third pass voltage have the same level.

16. The non-volatile memory device of claim 13, wherein:
the memory cells are serially connected forming a string where N is a number of memory cells in the string;
the selected memory cell is referred to as the j-th memory cell of the string; and
the voltage selector is configured to provide the verification voltage to the selected memory cell and the first pass voltage to j+1-th through N-th memory cells of the string during the program verification operation for the selected memory cell.

17. The non-volatile memory device of claim 16, wherein the voltage selector is configured to provide a third pass voltage to first through j−1-th memory cells of the string during the program verification operation for the selected memory cell.

18. The non-volatile memory device of claim 13, wherein:
the memory cells are serially connected forming a string; and
the voltage selector is configured to provide the first pass voltage having a level based on a place of the selected memory cell in the string.

19. The non-volatile memory device of claim 13, wherein the high voltage generator is a charge pump that pumps a reference voltage.

* * * * *